(12) United States Patent
Kim

(10) Patent No.: US 6,433,376 B2
(45) Date of Patent: Aug. 13, 2002

(54) FERROELECTRIC MEMORY INTEGRATED CIRCUIT

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 09/732,270

(22) Filed: Dec. 7, 2000

(30) Foreign Application Priority Data

Dec. 8, 1999 (KR) .............................. 99-55682

(51) Int. Cl.[7] ............................................. H01L 29/76
(52) U.S. Cl. .................... 257/295; 257/296; 257/300; 438/3
(58) Field of Search ................ 257/295, 296, 257/300; 438/3

(56) References Cited

U.S. PATENT DOCUMENTS

| | | |
|---|---|---|
| 5,081,559 A | 1/1992 | Fazan et al. |
| 5,192,704 A * | 3/1993 | McDavid et al. ............. 438/3 |
| 5,387,532 A | 2/1995 | Hamamoto et al. |
| 5,495,117 A | 2/1996 | Larson |
| 5,767,541 A | 6/1998 | Hanagasaki |
| 6,066,869 A | 5/2000 | Noble et al. |
| 6,075,264 A | 6/2000 | Koo |
| 6,153,490 A * | 11/2000 | Xing et al. .................. 438/396 |
| 6,249,458 B1 * | 6/2001 | Shokouhi et al. ....... 365/185.23 |

FOREIGN PATENT DOCUMENTS

JP     06151762 A *   5/1994 ................. 257/295

* cited by examiner

*Primary Examiner*—Nathan Flynn
*Assistant Examiner*—Scott R. Wilson
(74) *Attorney, Agent, or Firm*—Timothy J. Keefer; Wildman, Harrold, Allen & Dixon

(57) ABSTRACT

The disclosed semiconductor device comprises a semiconductor substrate, a logic circuit area formed on the semiconductor substrate, the logic circuit area includes transistors for driving bit lines, and a ferroelectrics memory area laminated on the logic circuit area and including a transistor area and a capacitor area. Also the disclosed method of fabricating the semiconductor device comprises the steps of forming a logic circuit area on a semiconductor substrate, the logic circuit area includes interconnection wirings connected to transistors for driving bit lines, forming bit lines electrically connected to the interconnection wirings at the upper side thereof, forming a silicon film connected to the bit lines at the upper side thereof and defining a cell forming area, forming transistors on the silicon film, each transistor including a gate electrode, a source electrode, and a drain electrode, and forming capacitors electrically connected to the source electrodes at the upper side of the transistor.

4 Claims, 4 Drawing Sheets

FERROELECTRIC MEMORY INTEGRATED CIRCUIT

CROSS REFERENCE TO RELATED APPLICATION

This application claims the priority of Korean patent application Serial No.99-55682 filed on Dec. 8, 1999.

BACKGROUND OF THE INVENTION

1. Field of the Invention

The present invention relates to a semiconductor device and a method of manufacturing thereof, and more particularly to a semiconductor device having ferroelectric memories fit for a highly integrated semiconductor device and a method of manufacturing thereof.

2. Description of the Related Art

As well known, the recent trend to fabricate a semiconductor device is towards to a high degree of integration accompanied with a development of material, and improvements of equipments and process techniques and progress of design techniques used for fabricating it. As the semiconductor device is highly integrated, circuit elements manufactured respectively such as a capacitor, a transistor, and a resistor are integrated in one chip. Furthermore, the device in which the circuit elements are organically combined each other, such as a memory, is integrated in one chip.

Moreover, as electronic industries are developed, it is required of the memory that is driven at lower voltage than the conventional memory and has a high speed of data process. Therefore, to satisfy the requirement, a large number of memories are developed and used commercially or being developed.

The ferroelectrics memory among the memories being developed is expected to substitute for DRAM in the future and is in the progress of development and research since it has advantages that a driving voltage is low, a speed of data process is fast, and durability as well as reliance is high.

The ferroelectrics memory uses ferroelectric material having a perovskite structure such as $PbTiO_3$[BT], (Pb, La)$TiO_3$[PLT], Pb(Zr, Ti)$O_3$[PZT], (Pb, La)(Zr, Ti)$O_3$ as a capacitor dielectric film, and write and read data by the spontaneous polarization of the ferroelectrics.

That is, when the ferroelectrics is interposed between both electrodes and voltages having different electric potential are applied to each electrode, the ferroelectrics is polarized to a specific direction spontaneously. Read and write of data are performed by using the polarization direction.

For example, when the voltage of 5V is applied to an upper electrode and the voltage of 0V is applied to a lower electrode, the ferroelectrics interposed between both electrodes is polarized to the positive potential, thereby writing data "1". Conversely, when 0V is applied to the upper electrode and 5V is applied to the lower electrode, the ferroelectrics is polarized to the-negative potential, thereby writing data "0".

In case of data read, when 5V is applied to the upper electrode and 0V is applied to the lower electrode, the output voltage is compared with the reference voltage. If the output voltage is greater than the reference voltage, data "1" is read out. On the contrary, if the output voltage is smaller than the reference voltage, data "0" is read out. Herein, the output voltage is changed according to the direction of spontaneous polarization of the ferroelectrics.

As described above, the ferroelectrics memory is not affected by leakage current since it writes and reads data using the spontaneous polarization instead of a quantity of electric charges stored in capacitor.

However, although the ferroelectrics memory has the advantages as mentioned above, DRAM is generally incorporated in the semiconductor device to write and read data. The structure of semiconductor device having a memory like the above will be explained as following.

Although it is not shown in figures, a logic circuit area and a memory area are formed on the same plane of a semiconductor substrate with a predetermined area(for example, area ratio 1:1).

As described above, when the logic circuit area and the memory area are formed on the same plane, the utilization efficiency of the semiconductor substrate, namely the degree of integration becomes lowered. However such a construction prevents the capacitor from misoperating by a leakage current in spite of the disadvantage.

In more detail, the memory has a plurality of unit cells respectively consisting of one transistor and one capacitor and writes data by charging electric charges in the capacitor to correspond to the drive of the transistor. In reading the written data, the memory compares the voltage generated by charges stored in the capacitor with a predetermined reference voltage and determines whether the data stored in the capacitor is "1" or "0".

For example, when DC voltage is applied to the capacitor, the memory compares the voltage outputted from the capacitor with the reference voltage, and reads out as data "1" if the output voltage is greater than the reference voltage. On the contrary, if the output voltage is smaller than the reference voltage, the memory reads out data as data "0".

And, when the memory is formed on the upper portion of a logic circuit area to improve a degree of integration, electric charges stored in the capacitor may be lost by the leakage current in the capacitor of unit cells in memory.

For instance, electric charges stored in the capacitor may be lost by the leakage current generated when the transistor connected to the capacitor is off or at impurity diffusion area connected to the capacitor.

As explained above, when electric charges stored in loss of electric charges is great, the output voltage is lowered than the reference voltage. As a result, data "1" is read in the capacitor in which data "1" is stored.

Accordingly, until a recent date, there has been a problem that logic circuit area and memory should be formed on the same plane of the semiconductor device to assure reliance thereof, which inevitably results in decrease of integration degree.

SUMMARY OF THE INVENTION

Therefore, an object of the invention is to provide a semiconductor device having the ferroelectrics memory fit for the highly integrated semiconductor device and a method of manufacturing thereof.

In order to achieve the object, the semiconductor device according to the present invention comprises: a semiconductor substrate; a logic circuit area formed on the semiconductor substrate, the logic circuit area includes transistors for driving bit lines; and a ferroelectrics memory area laminated on the logic circuit area and including a transistor area and a capacitor area.

And also, the semiconductor device further comprises interconnection wirings formed on the logic circuit area and electrically connected to the transistors; bit lines formed on the upper part of the interconnection wirings, and electrically connected to the interconnection wirings; a silicon film formed on the upper side of the bit lines and defining a cell forming area; a transistor area formed on the silicon film and comprising a gate electrode, a source and a drain; and a capacitor formed on each transistor and electrically connected to the source of the transistor.

The method of fabricating a semiconductor device according to the present invention comprises steps of forming logic circuit area having interconnection wiring connected to bit line driving transistor on semiconductor substrate; forming bit line electrically connected to the interconnection wiring over the interconnection wiring; forming silicon film connected to the bit line over the bit line and restricting cell forming area; forming transistor consisting of gate electrode, source electrode, and drain electrode on the silicon film; and forming capacitor electrically connected to the source electrode over the transistor.

Moreover, another method of fabricating a semiconductor device according to the present invention comprises steps of forming a logic circuit area including interconnection wirings connected to bit line driving transistors on a semiconductor substrate; forming a first layer intermediate insulating film on the entire surface for exposing the upper side of the interconnection wirings; forming bit lines electrically connected the interconnection wirings on the first layer intermediate insulating film; forming a second layer intermediate insulating film on the entire surface after forming the bit lines for exposing the a part of the bit lines; defining a cell forming area by selectively patterning the second layer intermediate insulating film; forming a silicon film on a part of the defined cell forming area, the silicon film is connected to the bit lines; forming a gate insulating film and a gate electrode on the silicon film; forming a source electrode and a drain electrode on the silicon film situated under the both sides of the gate electrode; forming a lower electrode for a capacitor on the entire surface to expose the source electrode; and forming a dielectric film and an upper electrode on the lower electrode.

BRIEF DESCRIPTION OF THE DRAWINGS

The above object, and other features and advantages of the present invention will become more apparent after a reading of the following detailed description.

DETAILED DESCRIPTION OF THE INVENTION

Now, the present invention will be described in detail, with reference to the annexed drawings.

Figure 1:
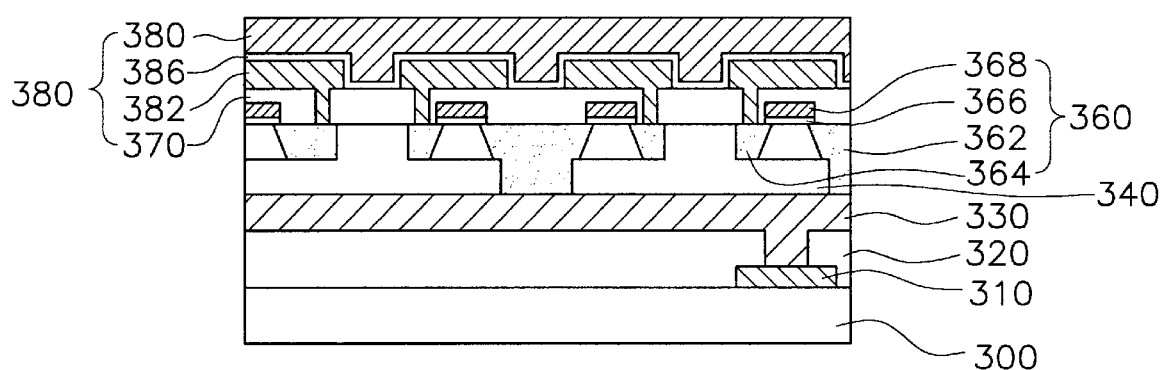
FIG. 1 is a cross-sectional view of a semiconductor device in accordance with the present invention.

FIG. 1 is a cross sectional view of the semiconductor device according to the present invention.

As shown in FIG. 1, a semiconductor device comprises a logic circuit area(not shown) insulated by first, second, and third layer intermediate insulation films 320, 340, and 370 formed on a semiconductor substrate 300, a transistor area (not shown), and a capacitor area(not shown).

And, the logic circuit area, the transistor area, and the capacitor area respectively have a structure being selectively electrical connected penetrating layer intermediate insulation films 320, 340, and 370. The logic circuit area is formed on the semiconductor substrate 300, having a specific construction according to the function of each semiconductor device, and the transistor area comprises a plurality of transistors 360 formed on the silicon film 350 divided by the semiconductor substrate 300 and the second layer intermediate insulation film 340. The capacitor area comprises a plurality of capacitors 380 divided from the transistor area by the third layer intermediate insulation film 370.

A bit line 330 penetrates the second layer intermediate insulation film 340 and is connected to respective source electrode 364 in transistors 360, and each drain electrode 362 of transistors 360 penetrates the third layer intermediate insulation film 370 and is connected to a lower capacitor electrode 382 in a plurality of capacitors.

In accordance with present invention, a method of manufacturing the semiconductor device will be described in detail referring to annexed drawings.

FIG. 2 to FIG. 7 are process cross-sectional views illustrating the method of manufacturing the semiconductor device according to the present invention.

Figure 2:
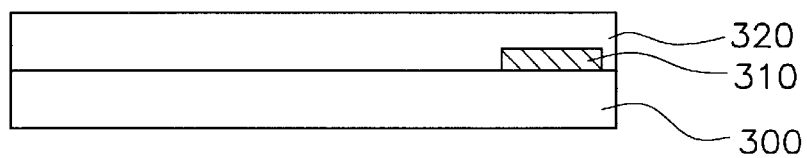
FIG. 2 through FIG. 7 is a process cross-sectional view explaining the method of manufacturing the semiconductor device in accordance with the present invention.

Although not shown in FIG. 2, a semiconductor substrate 300 is prepared to form a logic circuit area. The semiconductor substrate 300 comprises interconnection wirings 310 formed thereon.

Thereafter, through typical techniques for evaporating an insulation film, such as Chemical Vapor Deposition CVD, a first layer intermediate insulation film 320 is formed by laminating materials of insulator (for example, oxide film) on the entire surface of the upper portion of the semiconductor substrate 300 having the interconnection wirings 310.

Figure 3:
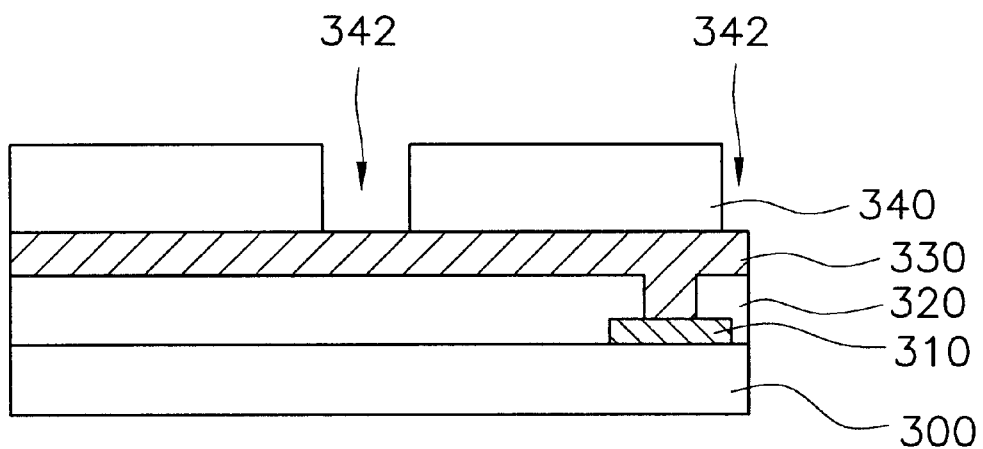

Then, as shown in FIG. 3, contact holes (not shown) exposing the interconnection wirings 310 by patterning the first layer intermediate insulation film 320, is formed by photolithography techniques.

Then, on the entire surface of the upper part of the first layer intermediate insulation film 320 including the contact holes (not shown), conductor (for example, silicon film, compounds of silicon and metal, or tungsten) is laminated by using typical techniques for laminating conductors(for example, sputtering method).

Herein, the interconnection wirings 310 exposed through the contact hole (not shown) are electrically connected to the conductors(not shown) laminated on the upper part of the first layer intermediate insulation film 320 since the conductors (not shown) are sufficiently filled in the contact holes (not shown) formed on the first layer insulation film 320.

Then, bit lines 330 are formed by selectively patterning the laminated conductors (not shown) using he photolithography technique. Herein, as shown in FIG. 3, it is described that the bit line 330 is formed on the entire upper part of the first layer intermediate insulation film 310. However, actually, the bit line comprises a plurality of lines formed on the plane, and is the same as the bit line pattern typical used in processes for manufacturing memories. Therefore the plan view showing this will be omitted.

And, the bit line 330 and the transistor for driving it are respectively connected one-to-one by the conductor filled in the contact hole(not shown). Herein, the bit line is formed before transistor connected to capacitor is formed. However, it is possible to be formed after transistor is formed.

Then, a second layer intermediate insulation film 340 is formed on the entire surface of the upper part of structure having the bit line 330 by using the same as or similar to method for forming the first layer intermediate insulation film 320.

Then, a plurality of contact holes 342 are formed by patterning the second layer intermediate insulation film 340 through typical photolithography method to connect electrically respective silicon film of cell unit to be formed in follow-up process and bit line 330. Here, a part of bit line 330 located on the lower part of the second layer intermediate insulation film 340 is exposed through the contact hole 342.

Figure 4:
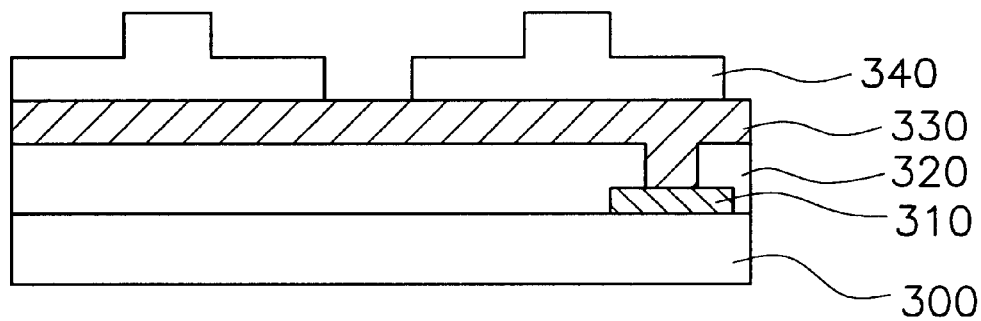

Then, as illustrated in FIG. 4, the predetermined area including the contact holes 342 formed on the second layer intermediate insulation film 340, that is silicon film area of cell unit to be formed in the next process, is restricted by patterning 340 the second layer intermediate insulation film again through the photolithography method.

Then, a silicon film (not shown) is laminated on the entire surface of the upper part of the second layer intermediate insulation film 340 having the contact holes and the silicon film forming area by typical general silicon lamination methods(for example, chemical or physical vapor deposition).

Figure 5:
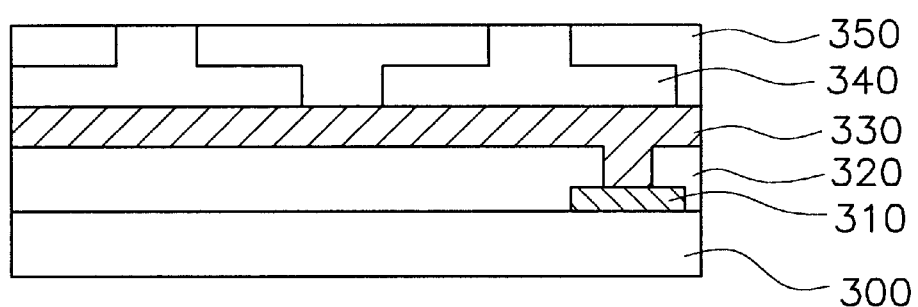

Then, as shown in FIG. 5, the silicon film pattern 350 is formed by respective cell unit when the laminated silicon film is removed to the surface of the second layer intermediate insulation film 340 by an etch back or a chemical mechanical polishing CMP. Herein, a part of the second layer intermediate insulation film is patterned to make the silicon film forming area. However patterning after evaporating the silicon film instead of said process may form the silicon film.

Figure 6:
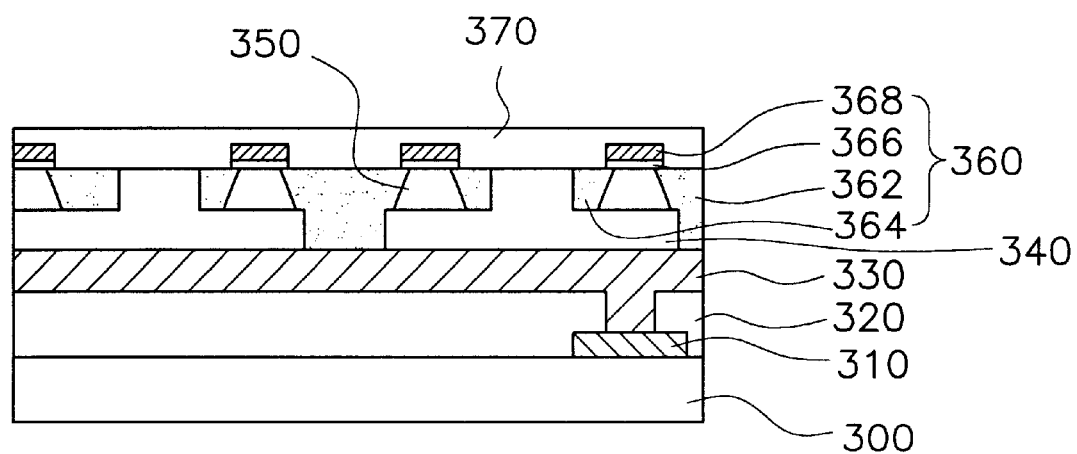

Then, as illustrated in FIG. 6, when a gate insulation material layer (not shown) and a gate material layer (not shown) are evaporated on the upper part of the conductor and are selectively patterned through a process to be exposed to lights and a development process, a gate insulation film 366 and a gate electrode 368 are formed sequentially on the upper part of the silicon film 350.

Then, transistor 360 is formed on silicon film 350 separated into each cell unit by forming the drain electrode 362 and the source electrode 364 through doping impurities in the silicon film 350 located under both sides of the gate electrode 368.

And then, a third layer intermediate insulation film 370 is formed over the structure in which the transistor 360 is formed.

Figure 7:
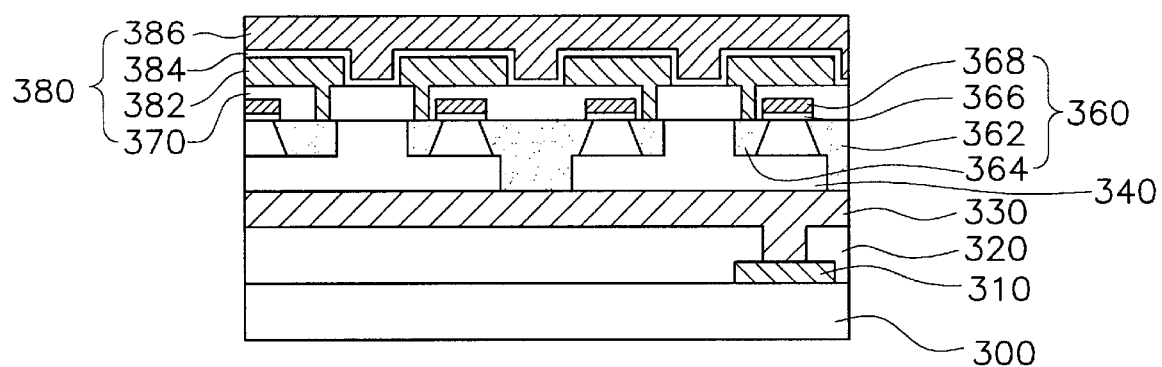

Then, as shown in FIG. 7, the third layer intermediate insulation film 370 is separated into the cell unit after selectively patterning it to be exposed the upper surface of the drain electrode 364 using a typical photolithography method.

Then, on the upper part of the third intermediate insulation film 370 and respective source electrode 364 exposed when the third layer intermediate insulation film 370 is separated, conductive material layer is laminated. Thereafter, the lower electrode of the capacitor 382 is formed by patterning the conductive material layer to separate it into cell unit.

And then, when a ferroelectrics film 384 is evaporated on the upper part of the lower electrode 382 and of the third layer intermediate insulation film 370 patterned, a ferroelectrics capacitor 380 is completed by forming upper electrode 386 of capacitor on the ferroelectrics film.

In order to form the ferroelectrics film 384, materials such as $PbTiO_3$[BT], (Pb La)$TiO_3$[PLT], Pb(Zr, Ti)$O_3$[PZT], (Pb, La) (Zr, Ti)$O_3$[PLZT], and SBT($SrBi_2Ta_2O_9$) can be used.

As explained above, the advantages of present invention are as following.

In accordance with present invention, the integration degree of the semiconductor device having the ferroelectrics memory can be improved since the integration degree can be high without any misoperation by laminating the ferroelectrics memory area not affected by a leakage current on the upper part of the logic circuit area.

What is claimed is:

1. A semiconductor device comprising:

a semiconductor substrate;

a logic circuit area formed on the semiconductor substrate, including transistors for driving bit lines;

a ferroelectrics memory area laminated on the logic circuit area and including a transistor area and a capacitor area;

interconnection wirings formed on the logic circuit area and electrically connected to the transistors;

bit lines formed on the upper part of the interconnection wirings, and electrically connected to the interconnection wirings;

silicon film formed on the upper side of the bit lines and defining a cell forming area;

a transistor area formed on the silicon film and comprising a gate electrode, a source and a drain, wherein the gate electrode is formed on the silicon film, and the source and drain are formed in the silicon film located under both sides of the gate electrode; and a capacitor formed on each transistor and electrically connected to the drain of the transistor.

2. The semiconductor device according to claim 1, wherein a first layer intermediate insulation film is formed between interconnection wirings and bit lines.

3. The semiconductor device according to claim 1, wherein a second layer intermediate insulation film is formed between the bit lines and the silicon film.

4. The semiconductor device according to claim 1, wherein a third layer intermediate insulation film is formed between the silicon film and the capacitors.

* * * * *